United States Patent
Endo

(10) Patent No.: US 11,454,667 B2
(45) Date of Patent: Sep. 27, 2022

(54) INSPECTION APPARATUS AND METHOD OF ADJUSTING POSITION OF CHUCK TOP

(71) Applicant: TOKYO ELECTRON LIMITED, Tokyo (JP)

(72) Inventor: Tomoya Endo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/205,803

(22) Filed: Mar. 18, 2021

(65) Prior Publication Data
US 2021/0302492 A1    Sep. 30, 2021

(30) Foreign Application Priority Data

Mar. 25, 2020    (JP) .............................. JP2020-054848

(51) Int. Cl.
G01R 31/28    (2006.01)
(52) U.S. Cl.
CPC .............................. *G01R 31/2875* (2013.01)
(58) Field of Classification Search
CPC ............ G01R 31/2877; G01R 31/2875; G01R 31/2874
See application file for complete search history.

(56) References Cited

U.S. PATENT DOCUMENTS

| 4,786,867 A * | 11/1988 | Yamatsu ............ G01R 1/07342 |
| | | 324/754.13 |
| 2005/0046437 A1* | 3/2005 | Kim .................... G01R 31/2891 |
| | | 324/750.02 |
| 2018/0299487 A1 | 10/2018 | Yamada |

FOREIGN PATENT DOCUMENTS

| JP | 2013-191736 A | 9/2013 |
| JP | 2016-192549 A | 11/2016 |
| WO | 2010021427 A1 | 2/2010 |

* cited by examiner

*Primary Examiner* — Tung X Nguyen
(74) *Attorney, Agent, or Firm* — Nath, Goldberg & Meyer; Jerald L. Meyer; Tanya E. Harkins

(57) ABSTRACT

An inspection apparatus includes: a plurality of inspection devices configured to respectively inspect electronic devices of inspection objects on a plurality of chuck tops; a measurement device configured to measure height positions of a plurality of points on a surface of each of the plurality of chuck tops, which are respectively disposed to correspond to the plurality of inspection devices, or to measure distances in a height direction from a measurement reference point to the plurality of points; a calculation device configured to calculate adjustment amounts in the height direction at the plurality of points of each chuck top, based on the height positions of the plurality of points or the distances in the height direction from the measurement reference point to the plurality of points; and an adjustment mechanism configured to adjust, for each chuck top, an angle of the respective chuck top based on the adjustment amounts.

6 Claims, 5 Drawing Sheets

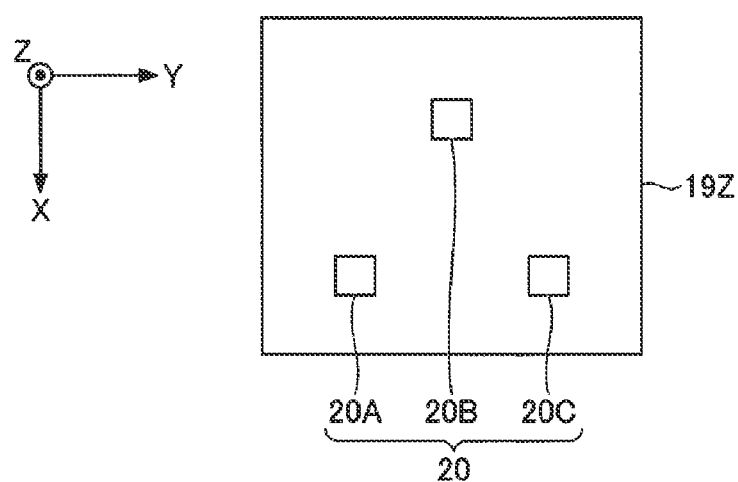

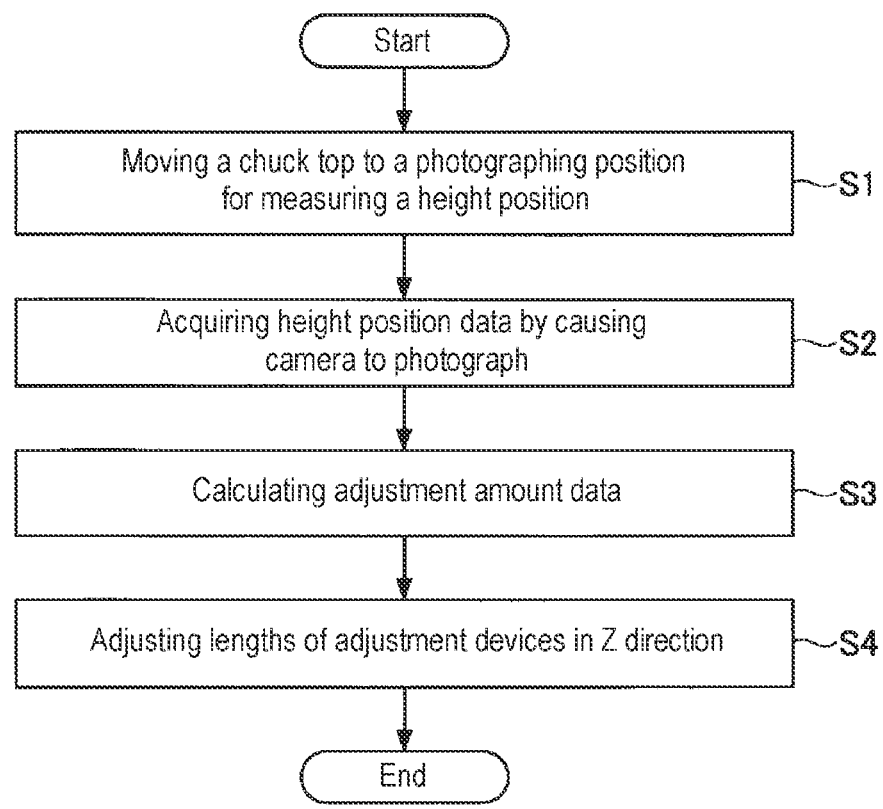

INSPECTION APPARATUS AND METHOD OF ADJUSTING POSITION OF CHUCK TOP

CROSS-REFERENCE TO RELATED APPLICATION

This application is based upon and claims the benefit of priority from Japanese Patent Application No. 2020-054848, filed on Mar. 25, 2020, the entire contents of which are incorporated herein by reference.

TECHNICAL FIELD

The present disclosure relates to an inspection apparatus and a method of adjusting a position of a chuck top.

BACKGROUND

Patent Document 1 discloses a technique of providing, on a surface in contact with a pogo frame of a probe card, a shim for adjusting thickness of the probe card, in a wafer inspection interface used for wafer inspection.

PRIOR ART DOCUMENT

Patent Document

Patent Document 1: Japanese Laid-Open Patent Publication No. 2013-191736

SUMMARY

According to one embodiment of the present disclosure, an inspection apparatus includes: a plurality of inspection devices configured to respectively inspect electronic devices of inspection objects on a plurality of chuck tops; a measurement device configured to measure height positions of a plurality of points on a surface of each of the plurality of chuck tops, which are respectively disposed to correspond to the plurality of inspection devices, or to measure distances in a height direction from a measurement reference point to the plurality of points; a calculation device configured to calculate adjustment amounts in the height direction at the plurality of points of each chuck top, based on the height positions of the plurality of points or the distances in the height direction from the measurement reference point to the plurality of points; and an adjustment mechanism configured to adjust, for each chuck top, an angle of the respective chuck top based on the adjustment amounts.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a diagram showing an adjustment mechanism.

FIG. 5 is a flowchart showing a process of a method for adjusting a position of a chuck top according to an embodiment.

DETAILED DESCRIPTION

Figure 1:
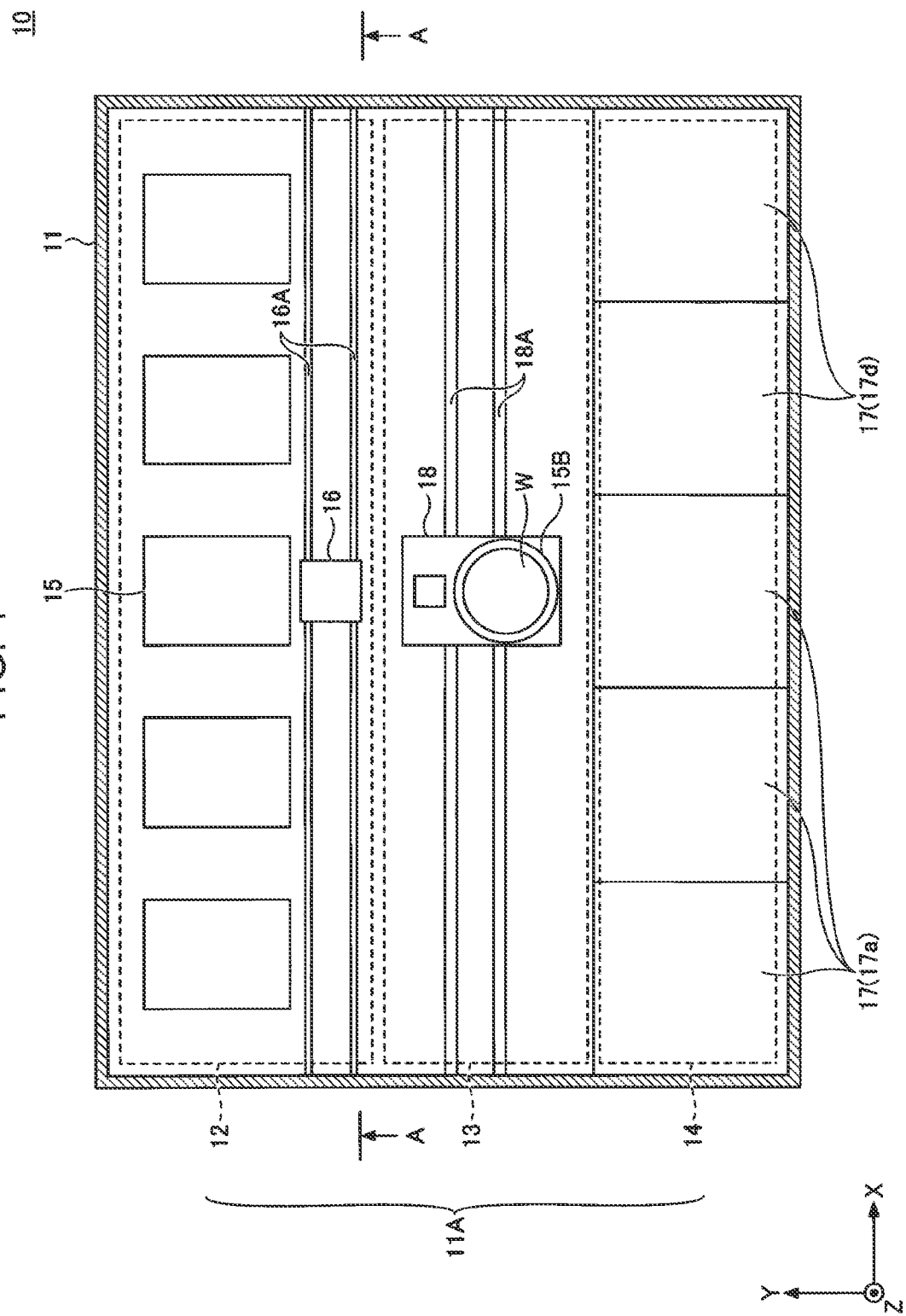
FIG. 1 illustrates a cross-sectional view showing an example of an inspection apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for carrying out the present disclosure will be described with reference to drawings. In the specification and drawings, substantially the same components will be denoted by the same reference numerals, and redundant descriptions may be omitted.

Embodiment

Figure 2:
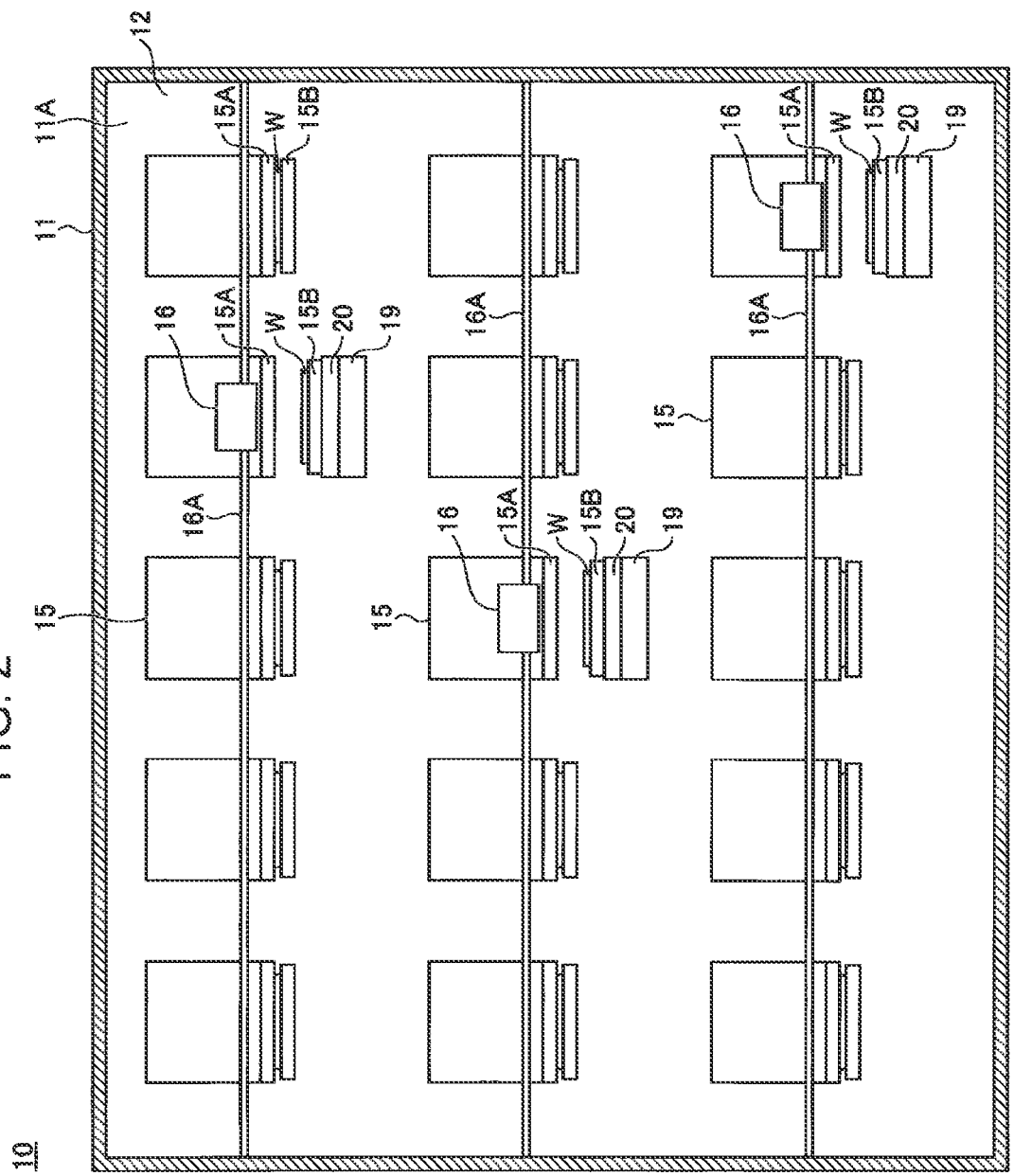
FIG. 2 is a diagram showing an example of a cross-sectional view of the entire inspection apparatus when viewed in a direction of arrows A-A in FIG. 1.

FIG. 1 illustrates a cross-sectional view showing an example of an inspection apparatus 10 according to an embodiment. FIG. 2 is a diagram showing an example of a cross-sectional view of the entire inspection apparatus 10 when viewed in a direction of arrows A-A in FIG. 1. In the following, an XYZ coordinate system, which is a Cartesian coordinate system, will be defined and described. The XY plane is a horizontal plane, and the Z direction is a vertical direction.

As illustrated in FIGS. 1 and 2, the inspection apparatus 10 includes a housing 11. The interior space of the housing 11 is an inspection room 11A. The inspection room 11A has an inspection area 12, a transport area 13, and a load port area 14.

In FIGS. 1 and 2, walls (walls substantially parallel to the XZ plane) partitioning the inspection area 12, the transport area 13, and the load port area 14, openings provided in the walls, or the like are omitted.

The inspection area 12 is an area in which electrical characteristics of an electronic device formed on a wafer W, which is an example of an inspection object, are inspected, and in which a plurality of testers 15 for wafer inspection, pogo frames 15A, a camera 16, an aligner 19, and an adjustment mechanism 20 are mainly disposed. A tester 15 and a pogo frame 15A are an example of an inspection device. One pogo frame 15A is provided under each tester 15. The camera 16 is an example of a measurement device, and is provided on a side where the testers 15 are. As an example, five testers 15 are disposed in the inspection area 12 in the X direction, and are provided in three stages in the vertical direction. In addition, one camera 16 is provided for each stage, and the camera 16 is movable in the X direction along rails 16A, Although the configuration illustrated in FIG. 1 is configuration of a portion including the testers 15 in the middle stage as an example, configuration of each stage is substantially the same. A plurality of testers 15 may be disposed in the inspection area 12 in the X direction, and may be provided in a plurality of stages in the vertical direction. In addition, one camera 16 may be provided for each tester 15. The aligner 19 and the adjustment mechanism 20 will be described later.

The transport area 13 is an area provided between the inspection area 12 and the load port area 14. In the transport area 13, rails 18A guiding a transport stage 18 in the X direction, are provided. The transport stage 18 will be described later.

The load port area 14 is divided into a plurality of accommodation spaces 17. As an example, the plurality of accommodation spaces 17 are divided into live spaces in the X direction and three stages in the vertical direction. FIG. 1 illustrates five accommodation spaces 17 located in the middle stage of the three stages. Three ports 17a, each accommodating a FOUP which is a container for accommodating a plurality of wafers W, are disposed in three accommodation spaces 17 among the five accommodation spaces 17 in the middle stage, and controllers 17d, each controlling each device of the inspection apparatus 10, are disposed in the remaining two accommodation spaces 17. The FOUP is an example of a carrier, and the port 17a is an example of a carrier accommodation space.

A pogo frame 15A for holding a probe card (not illustrated) is disposed under each tester 15. The pogo frame 15A is fixed to the housing 11. The pogo frame 15A has a pogo pin (not illustrated) for connecting to a terminal of an electronic device on a wafer W. The terminal of the electronic device on the water W is electrically connected to the tester 15 via the pogo frame 15A.

A chuck top 15B is a thick plate-shaped member and has a flat upper surface. The chuck top 15B may be attracted to the pogo frame 15A by a vacuum suction mechanism (not illustrated) in a state in which the chuck top 15B has been positioned with respect to the pogo frame 15A by the aligner 19 (see FIG. 2). In addition, the inspection apparatus 10 includes an adjustment mechanism 20. The adjustment mechanism 20 is provided on the aligner 19 and adjusts an angle of the chuck top 15B such that an upper surface (surface) of the chuck top 15B becomes horizontal. The details of the adjustment mechanism 20 will be described later with reference to FIG. 3.

When the chuck top 15B is attracted to the pogo frame 15A, a probe of a probe card is pressed against a terminal of an electronic device on the wafer W. One aligner 19 is provided for each stage. In FIG. 1, the aligner 19 may be disposed under any one of the five testers 15 and illustration thereof is omitted.

The chuck top 15B may have a heating mechanism (heater) configured to heat the wafer W, and may heat the wafer W to a desired temperature when the tester 15 inspects electrical characteristics of an electronic device on the wafer W. In addition, the chuck top 15B may have a cooling mechanism (a chiller) configured to cool the chuck top 15B using a cooling liquid.

At each stage, the camera 16 moves in the X direction along the rails 16A to photograph a position of the wafer W held on an upper surface of a chuck top 15B and a position of the chuck top 15B. The image data acquired by the camera 16 is used when position alignment of the wafer W is performed by the aligner 19, and is also used when measuring the position (hereinafter, a height position) of the upper surface of the chuck top 15B in the Z direction. The height position of the chuck top 15B is expressed as, for example, a height position with respect to a predetermined height reference point in the inspection apparatus 10.

The transport stage 18 is an example of a transport mechanism. The transport stage 18 is movable within the transport area 13 in the X direction along the rails 18A. The transport stage 18 has an arm or the like which is operable in the Y direction and the Z direction, and may transport a wafer W or the like in the X direction, the Y direction, and the Z direction. The transport stage 18 receives a wafer W from a port 17a in the load port area 14, transports the wafer W in the X direction in the transport area 13, and delivers the wafer W to the aligner 19. In addition, the transport stage 18 receives a wafer W, for which inspection of electrical characteristics of an electronic device has been completed, from the aligner 19, transports the wafer W in the X direction in the transport area 13, and delivers the wafer W to a port 17a.

The aligner 19 is an example of a position alignment mechanism, and receives a wafer W from the transport stage 18. The aligner 19 transports the chuck top 15B, which is holding the wafer W, to each tester 15 and performs position alignment of the wafer W with respect to a probe card held by the pogo frame 15A. In the state in which such position alignment is performed, the chuck top 15B may be attracted to the pogo frame 15A by a vacuum suction mechanism (not illustrated). The aligner 19 receives the chuck top 15B holding the wafer W, for which the inspection of the electrical characteristics of the electronic device has been completed, onto the adjustment mechanism 20 from the pogo frame 15A, and delivers the wafer W to the transport stage 18.

Figure 3:
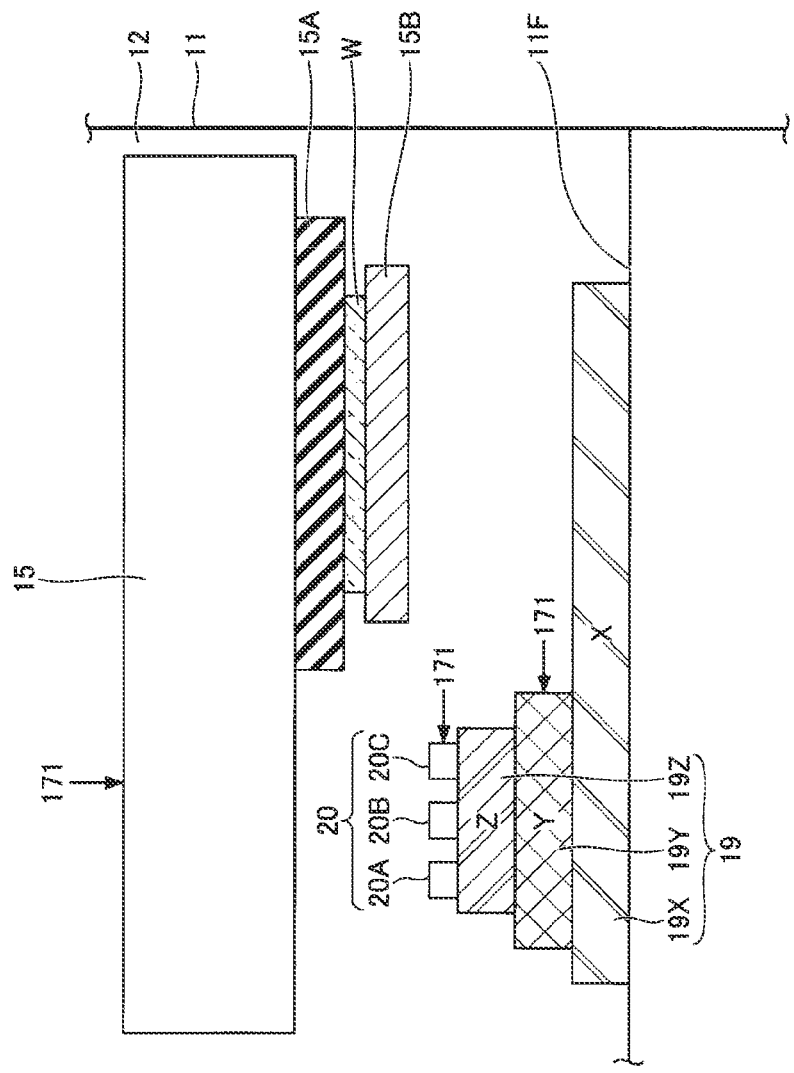
FIG. 3 is a diagram illustrating an aligner and an adjustment mechanism of the inspection apparatus.

FIG. 3 is a diagram illustrating an aligner 19 and an adjustment mechanism 20 of an inspection apparatus 10. FIG. 4 is a diagram showing the adjustment mechanism 20. FIG. 3 illustrates a YZ cross-sectional view of structures around one tester 15 included in one of the three vertical stages. The aligner 19 is provided on a floor 11F of each stage of the housing 11. In addition, FIG. 3 illustrates a controller 17d, but a camera 16 is omitted. The aligner 19 and the adjustment mechanism 20 are driven and controlled by the controller 17d.

One aligner 19 is provided in each of the three vertical stages. The aligner 19 has a configuration in which an X stage 19X, a Y stage 19Y, and a Z stage 19Z are overlapping in that order from the bottom to the top. The X stage 19X is movable in the X direction, the Y stage 19Y is movable in the Y direction with respect to the X stage 19X, and the Z stage 19Z is movable in the Z direction with respect to the Y stage 19Y. The adjustment mechanism 20 is provided on an upper surface of the Z stage 19Z.

When the aligner 19 transports a wafer W between a transport stage 18 (see FIG. 1) and a tester 15, it is desirable to keep the wafer W horizontal in order to suppress the displacement, breakage, or the like of the wafer W. For that purpose, the upper surface of the chuck top 15B should be horizontal.

However, in some cases, the upper surface of the chuck top 15B may not be horizontal because the upper surface of the Z stage 19Z is not horizontal due to, for example, misalignment of the X stage 19X, the Y stage 19Y, and the Z stage 19Z of the aligner 19 in position with one another as a result of aging or the like. In addition, the upper surface of the chuck top 15B may not be horizontal due to, for example, an individual difference or deformation of each chuck top 15B. In such a case, in this embodiment, the adjustment mechanism 20 adjusts an angle of the chuck top 15B such that the upper surface of the chuck top 15B becomes horizontal.

The adjustment mechanism 20 has adjustment devices 20A, 20B, and 20C. The adjustment devices 20A, 20B, and 20C are fixed to the upper surface of the Z stage 19Z. As illustrated in FIG. 4, for example, the adjustment devices 20A, 20B, and 20C are arranged so as to be located at vertices of a triangle in a plan view, rather than on a straight line. This is to support the chuck top 15B at three points.

The adjustment devices 20A, 20B, and 20C are actuators that may be expanded and contracted in the Z direction, and the lengths thereof in the Z direction are adjusted such that the upper surface of the chuck top 15B becomes horizontal based on adjustment amount data input from the controller 17d. The aligner 19 holds the chuck top 15B via such an adjustment mechanism 20 and transports the chuck top 15B to each tester 15. The adjustment amount data will be described later.

In order to adjust lengths of the adjustment devices 20A, 20B, and 20C in the Z direction such that the upper surface of the chuck top 15B becomes horizontal, the controller 17d performs the following controlling process. Here, the controller 17d is implemented, for example, by a computer including a central processing unit (CPU), a random access memory (RAM), a read only memory (ROM), a hard disk drive (HDD), an input/output interface, an internal bus, and the like.

The controller 17d includes a control device 171, a calculation device 172, and a memory 173. The control device 171 and the calculation device 172 represent functions of a program executed by the controller 17d as function blocks. Further, the memory 173 functionally represents the memory of the controller 17d, such as a RAM, a ROM, or a HDD.

The control device 171 is a part of the controller 17d that controls operations of each device of the inspection apparatus 10. The control device 171 acquires image data representing positions of the wafer W and the chuck top 15B from the camera 16 (see FIGS. 1 and 2). This is to use the image data for position alignment of the wafer W and the chuck top 15B by the aligner 19.

The position alignment of the wafer W by the aligner 19 is performed by a θ axis adjustment stage (not illustrated) included in the aligner 19 in addition to the X stage 19X, the Y stage 19Y, and the Z stage 19Z. The position alignment of the chuck top 15B by the aligner 19 is performed by adjusting the positions of the X stage 19X, the Y stage 19Y, and the Z stage 19Z in the X, Y, and Z directions. The control device 171 generates a command to be used for driving and controlling of the aligner 19 based on the image data representing the positions of the wafer W and the chuck top 15B, and transmits the command to the aligner 19.

The control device 171, via, a photograph command, causes the camera 16 to perform photographing of three points of predetermined locations on the upper surface of the chuck top 15B in a state in which the chuck top 15B has been moved by the aligner 19 to a photographing position for measuring a height position of the chuck top 15B. At the photographing position for measuring the height position of the chuck top 15B, position alignment of the chuck top 15B in the X direction and Y direction with respect to the pogo frame 15A is performed by the X stage 19X and the Y stage 19Y, and position alignment is performed by the Z stage 19Z such that the upper surface of the chuck top 15B is located at a height position for photographing. The three points of the predetermined positions on the upper surface of the chuck top 15B are not positioned in a straight line on the upper surface of the chuck top 15B, but are arranged to form a triangle in a plan view. Hereinafter, the three points will be referred to as "three points on the upper surface of the chuck top 15B".

At the time of photographing, the lengths of the adjustment devices 20A, 20B, and 20C of the adjustment mechanism 20 in the Z direction are set to, for example, lengths that are not adjusted by adjustment amount data e.g., when an adjustment amount represented by the adjustment amount data is zero). This is to obtain heights of three points on the upper surface of the chuck top 15B in a state in which the adjustment amount is zero. Further, when the adjustment amount data has already been obtained and the second or a subsequent photographing is performed, the lengths may be set to lengths adjusted by the adjustment amount data obtained at the time of photographing. This is because, if there is misalignment in the heights of the three points on the upper surface of the chuck top 15B obtained from the adjustment amount data acquired at the time of photographing, it is possible to obtain adjustment amount data for further adjustment.

The height position for photographing may be any position and may be determined in advance, as long as the chuck top 15B is not in contact with the pogo frame 15A and the upper surface of the chuck top 15B can be photographed by the camera 16 at that position.

The camera 16 acquires data (hereinafter, referred to as "height position data") indicating the height positions of the three points on the upper surface of the chuck top 15B in the Z direction from data (hereinafter, referred to as "focal length date") that represent focal lengths obtained when the three points on the upper surface of the chuck top 15B are focused through an autofocus function while being photographed separately, and outputs the height position data to the control device 171. The camera 16 that performs this process is an example of a measurement device. For example, by subtracting the focal length from the height position of the camera 16 with respect to a predetermined height reference point determined in the inspection apparatus 10, it is possible to acquire the height position data of three points on the upper surface of the chuck top 15B with respect to the height reference point. When photographing the three points on the upper surface of the chuck top 15B separately, the camera 16 may be moved to a position directly above each of the three points.

The control device 171 acquires from the camera 16 the height position data of three points on the upper surface of the chuck top 15B at the photographing position for measuring the height position of the chuck top 15B. The control device 171 transmits the acquired height position data of the three points to the calculation device 172. As an example, the three points on the upper surface of the chuck top 15B may be three points directly above the adjustment devices 20A, 20B, and 20C. This is because a change in the lengths of the adjustment devices 20A, 20B, and 20C in the Z direction is directly reflected in a change in the height positions of the three points at predetermined positions, and may be easily calculated.

Further, here, although the embodiment in which the camera 16 acquires the height position data of three points on the upper surface of the chuck top 15B and outputs the data to the control device 171 is described, some processes may be performed by the control device 171. For example, the camera 16 may output, to the control device 171, the focal length data obtained when the three points on the upper surface of the chuck top 15B are focused through the autofocus function while the three points are photographed, and the control device 171 may obtain the height position data of the three points on the upper surface of the chuck top 15B from the focus length data. In this case, a part of the camera 16 or the control device 171 that performs the process of obtaining the height position data is an example of the measurement device.

The calculation device 172 compares the height position data of the three points acquired from the control device 171 and calculates adjustment amount data. The adjustment amount data is data representing adjustment amounts of the lengths of the adjustment devices 20A, 20B, and 20C of the adjustment mechanism 20 in the Z direction.

Further, the adjustment amount data represents adjustment amounts for aligning the height positions of the three points in order to adjust an angle of the chuck top 15B such that the upper surface of the chuck top 15B becomes horizontal. The angle of the chuck top 15B is represented by, for example, an angle of the normal line of the flat upper surface of the chuck top 15B, and adjusting the angle of the chuck top 15B is adjusting the angle of the normal line. The upper surface of the chuck top 15B becomes horizontal when the normal line is oriented in the vertical direction. In order to make the upper surface of the chuck top 15B horizontal, it is sufficient to align the height positions of the three points on the upper surface of the chuck top 15B (making the height positions of the three points on the upper surface of the chuck top 15B to be the same). Therefore, the adjustment amount data represents adjustment amounts for aligning the height positions of the three points on the upper surface of the chuck top 15B.

In order to align the height positions of the three points on the upper surface of the chuck top 15B, the adjustment amount data may be data representing adjustment amounts for adjusting the lengths of the adjustment devices 20A, 20B, and 20C in the Z direction such that the height positions are aligned to a height position of any one of the three points. The adjustment amount data is calculated for each of the adjustment devices 20A, 20B, and 20C.

The calculation device 172 calculates the adjustment amount data when the chuck top 15B is transported, and stores the calculated adjustment amount data in the memory 173. By photographing each chuck top 15B by the camera 16, the height position data of the three points for each chuck top 15B may be obtained. The calculation device 172 may calculate the adjustment amount data for each chuck top 15B, and may store the calculated adjustment amount data in the memory 173.

As an example, each adjustment amount data may be managed in the memory 173 using an identifier assigned to a combination of a tester 15 and a chuck top 15B. The reason that the identifier is assigned to the combination of the tester 15 and the chuck top 15B is to determine and use the combination because the pogo frames 15A and the chuck tops 15B have individual differences. Therefore, when the combination of the tester 15 and the chuck top 15B is changed, the adjustment amount may be recalculated and added to the memory 173. When it is not necessary to consider the combination of the tester 15 and the chuck top 15B in this way, the adjustment amount data may be identified with an assigned identifier of a chuck top 15B.

Further, here, although an embodiment in which the calculation device 172 calculates the adjustment amount data for aligning the height positions of the three points using the height position data of the three points on the upper surface of the chuck top 15B acquired by the camera 16 is described, the following may be performed as well.

The camera 16 may output, to the control device 171, the focal length data obtained when the three points on the upper surface of the chuck top 15B are separately photographed, and the calculation device 172 may calculate the adjustment amount data for aligning focal lengths used when photographing the three points by using the focal length data acquired from the control device 171. In order to align the focal lengths when photographing the three points, the adjustment data may be calculated for adjusting the lengths of the adjustment devices 20A, 20B, and 20C in the Z direction such that the focal lengths are aligned to a focal length of any one of the three points. The adjustment amount data is calculated for each of the adjustment devices 20A, 20B, and 20C. By adjusting each of the lengths of the adjustment devices 20A, 20B, and 20C in the Z direction using the three adjustment amount data, the height positions of the three points on the upper surface of the chuck top 15B are aligned.

When calculating the adjustment amount data in this way, because it is not necessary to obtain the height position data of the three points on the upper surface of the chuck top 15B with respect to the height reference point based on the focal length data, the amount of calculation is reduced. Here, the positions of three places of the camera 16 when the camera 16 is moved to the three places directly above the three points on the upper surface of the chuck top 15B in order to photograph the three points on the upper surface of the chuck top 15B, are examples of measurement reference points.

The control device 171 reads the adjustment amount data stored in the memory 173 using an identifier, and adjusts the lengths of the adjustment devices 20A, 20B, and 20C of the adjustment mechanism 20, on which the chuck top 15B corresponding to the identifier is placed, in the Z direction. As a result, the lengths of the adjustment devices 20A, 20B, and 20C are adjusted in the Z direction based on the adjustment amount data so as to adjust the angle of the chuck top 15B, thereby making the upper surface of the chuck top 15B horizontal.

Further, here, an embodiment in which the adjustment mechanism 20 has three adjustment devices 20A, 20B, and 20C constituted with actuators, and the calculation device 172 calculates three adjustment amount data for adjusting the lengths of the three adjustment devices 20A, 20B, and 20C in the Z direction, has been described.

However, one of the adjustment devices 20A, 20B, and 20C may be a fixed device having a fixed length in the Z direction. In this case, the control device 171 may acquire the height position data of the three points on the upper surface of the chuck top 15B from the camera 16, and the calculation device 172 may calculate the adjustment amount data for two of the adjustment devices 20A, 20B, and 20C other than the fixed adjustment device. Then, the lengths of two of the adjustment devices 20A, 20B, and 20C other than the fixed device in the Z direction may be adjusted such that the upper surface of the chuck top 15B becomes horizontal. As described above, when one of the adjustment devices 20A, 20B, and 20C is a fixed device, the amount of calculation may be reduced, and the height position of the upper surface of the chuck top 15B may be easily managed.

When calculating the adjustment amount data from the focal length data such that the focal lengths when photographing the three points are aligned, if one of the adjustment devices 20A, 20B, and 20C is a fixed device, two adjustment amount data capable of aligning the focal lengths of the three points may each be calculated for two of the adjustment devices 20A, 20B, and 20C other than the fixed device.

The memory 173 stores adjustment amount data or the like, in addition to a program or data used when the controller 17d controls operations of the inspection apparatus 10.

FIG. 5 is a flowchart explaining a process of a method for adjusting a position of a chuck top according to an embodiment. As a precondition, it is assumed that the lengths of the adjustment devices 20A, 20B, and 20C, which are disposed on the aligner 19, in the Z direction are set to lengths that have not been adjusted based on adjustment amount data (e.g., when the adjustment amount represented by the adjustment amount data is zero), or to lengths that have been adjusted based on adjustment amount data obtained at the time of performing the process illustrated in FIG. 5 (e.g., the adjustment amount data acquired in a previous process).

First, the control device 171 causes a driving control of the aligner 19 using a command for photographing, and moves the chuck top 15B to a photographing position for measuring a height position of the chuck top 15B (step S1).

The control device 171 causes the camera 16 to photograph three points on the upper surface of the chuck top 15B, and acquires height position data from the camera 16 (step S2). By the process of the step S2, it is possible to find the height positions of the three points on the upper surface of the chuck top 15B.

The calculation device 172 compares the height positions of the three points acquired by the control device 171 and calculates three adjustment amount data for aligning the height positions of the three points (step S3). The calculation device 172 stores the adjustment amount data in the memory 173.

Here, if the height position data is acquired in the step S2 in a state in which lengths of the adjustment devices 20A, 20B, and 20C in the Z direction are not adjusted based on the adjustment amount data, the lengths of the adjustment devices 20A, 20B, and 20C in the Z direction may be adjusted by using the adjustment amount data calculated in step S3 as they are. In addition, if the height position data is acquired in step S2 in a state in which the lengths of the adjustment devices 20A, 20B, and 20C in the Z direction are adjusted based on the adjustment amount data calculated in a previous process, adjustment amount data obtained by adding the adjustment data calculated in step S3 and adjustment amounts calculated in the previous process may be used to adjust the lengths of the adjustment devices 20A, 20B, and 20C in the Z direction.

The control device 171 reads the adjustment amount data stored in the memory 173, and adjusts the lengths of the adjustment devices 20A, 20B, and 20C of the adjustment mechanism 20, on which the chuck top 15B corresponding to an identifier associated with the adjustment amount data is placed, in the Z direction (step S4). As a result, the lengths of the adjustment devices 20A, 20B, and 20C are adjusted in the Z direction based on the adjustment amount data to adjust an angle of the chuck top 15B, thereby making the upper surface of the chuck top 15B horizontal.

As described above, by calculating the adjustment amounts for each chuck top 15B, and by adjusting the lengths of the adjustment devices 20A, 20B, and 20C in the Z direction for each chuck top 15B using the adjustment amount data stored in the memory 173, the angle of the chuck top 15B may be easily adjusted.

Therefore, it is possible to provide the inspection apparatus 10 capable of easily adjusting the angle of the chuck top 15B and the method of adjusting the position of the chuck top. When the adjustment mechanism 20 is used, it is very easy to adjust the upper surface of the chuck top 15B to be horizontal.

Further, in order to adjust an angle of a chuck top 15B when the adjustment mechanism 20 does not adjust the angle of the chuck top 15B, or when the inspection apparatus 10 does not include the adjustment mechanism 20, a shim or spacer may be inserted, for example, between a lower surface side of the chuck top 15B or the aligner 19, and the chuck top 15B. However, the angle adjustment using the shim or the spacer takes a lot of time and effort, and it is necessary to perform adjustment each time the angle of the chuck top 15B is deviated. In addition, when there is a plurality of chuck tops 15B and the angle adjustment amount varies for each chuck top 15B, it becomes necessary to adjust each chuck top 15B using a shim or a spacer.

In contrast, the inspection apparatus 10 of an embodiment may calculate an adjustment amount according to individual differences, deformation, or the like in chuck tops 15B, or misalignment of the X stage 19X, the Y stage 19Y, and the Z stage 19Z, and may adjust the surfaces of the chuck tops 15B to be horizontal by the adjustment mechanism 20 using the adjustment amount data stored in the memory 173. Therefore, it is very easy to adjust the angle for making the upper surfaces of the chuck tops 15B horizontal.

Further, when the adjustment mechanism 20 is used, it is possible to adjust the angle within a short amount of time. Therefore, it is possible to provide the inspection apparatus 10 capable of performing high throughput inspections.

Since the adjustment mechanism 20 is fixed on the Z stage 19Z of the aligner 19, it is possible to easily correct an inclination of the aligner 19 caused by aging or the like, and an inclination of the chuck top 15B caused by individual differences or the like, and thus, it is easy to perform angle adjustments such that the upper surface of the chuck top 15B becomes horizontal.

One aligner 19 is provided in each stage in the vertical direction in the inspection area 12 of the inspection apparatus 10, and one adjustment mechanism 20 is provided on the aligner 19 in each stage. Therefore, the adjustment mechanism 20 is movable together with the aligner 19, and thus, upper surfaces of a plurality of chuck tops 15B may be adjusted to be horizontal in each stage with one adjustment mechanism 20.

Further, a frequency of calculating the adjustment amount data and adjusting the angle of the chuck top 15B may be appropriately determined according to a use status of the inspection apparatus 10, accuracy required for an angle of a chuck top 15B, or the like.

Further, although the embodiment in which the adjustment mechanism 20 has three adjustment devices 20A, 20B, and 20C and supports the chuck top 15B at three points has been described above, the number of the adjustment devices may be four or more.

According to an aspect, it is possible to easily adjust an angle of a chuck top.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus comprising:
 a plurality of inspection devices configured to respectively inspect electronic devices of inspection objects on a plurality of chuck tops;
 a measurement device configured to measure height positions of a plurality of points on a surface of each of the plurality of chuck tops, which are respectively disposed to correspond to the plurality of inspection devices, or to measure distances in a height direction from a measurement reference point to the plurality of points;

a calculation device configured to calculate adjustment amounts in the height direction at the plurality of points of each chuck top, based on the height positions of the plurality of points or the distances in the height direction from the measurement reference point to the plurality of points; and an adjustment mechanism configured to adjust, for each chuck top, an angle of the respective chuck top based on the adjustment amounts.

2. The inspection apparatus of claim 1, wherein the adjustment amounts are amounts of adjustment for aligning, for each chuck top, the height positions of the plurality of points or the distances in the height direction from the measurement reference point to the plurality of points.

3. The inspection apparatus of claim 1, wherein the adjustment amounts are amounts of adjustment for performing angle adjustments causing the surface of each chuck top to be horizontal.

4. The inspection apparatus of claim 1, further comprising a position alignment mechanism configured to perform position alignment of each chuck top with respect to a corresponding inspection device, wherein:

the adjustment mechanism is provided on the position alignment mechanism, and each chuck top is held by the position alignment mechanism via the adjustment mechanism configured to adjust the height positions of the plurality of points based on the adjustment amounts, in order for the position alignment to be performed.

5. The inspection apparatus of claim 4, wherein one adjustment mechanism and one position alignment mechanism are provided for the plurality of inspection devices, and are movable to locations of the plurality of inspection devices.

6. A method for adjusting a position of a chuck top in an inspection apparatus including a plurality of inspection devices configured to respectively inspect electronic devices of inspection objects on a plurality of chuck tops, the method comprising:

measuring height positions of a plurality of points on a surface of each of the plurality of chuck tops, which are respectively disposed to correspond to the plurality of inspection devices, or distances in a height direction from a measurement reference point to the plurality of points;

calculating adjustment amounts in the height direction at the plurality of points of each chuck top, based on the height positions of the plurality of points or the distances in the height direction from the measurement reference point to the plurality of points; and adjusting, for each chuck top, an angle of the respective chuck top based on the adjustment amounts.

* * * * *